US006946866B2

(12) United States Patent
Thurairajaratnam et al.

(10) Patent No.: US 6,946,866 B2
(45) Date of Patent: Sep. 20, 2005

(54) MEASUREMENT OF PACKAGE INTERCONNECT IMPEDANCE USING TESTER AND SUPPORTING TESTER

(75) Inventors: Aritharan Thurairajaratnam, San Jose, CA (US); Mohan Nagar, Cupertino, CA (US); Anand Govind, Fremont, CA (US); Farshad Ghahghahi, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/620,057

(22) Filed: Jul. 15, 2003

(65) Prior Publication Data

US 2004/0251925 A1 Dec. 16, 2004

Related U.S. Application Data

(63) Continuation-in-part of application No. 10/448,987, filed on May 30, 2003, now abandoned.

(51) Int. Cl.[7] .................... G01R 31/02; G01R 31/11
(52) U.S. Cl. .................. 324/765; 324/534; 324/754; 324/761; 324/763
(58) Field of Search ................. 324/73.1, 158.1, 324/750–765, 525, 176

(56) References Cited

U.S. PATENT DOCUMENTS

| | | | |
|---|---|---|---|
| 3,525,937 A | | 8/1970 | Mezer |
| 4,739,276 A | * | 4/1988 | Graube .................. 324/534 |
| 4,766,386 A | | 8/1988 | Oliver et al. |
| 4,866,302 A | | 9/1989 | Whiteley et al. |
| 5,394,100 A | | 2/1995 | Bohler et al. |
| 5,633,801 A | * | 5/1997 | Bottman .................. 702/65 |
| 5,726,578 A | | 3/1998 | Hook |
| 5,823,790 A | * | 10/1998 | Magnuson ............... 439/63 |
| 5,949,245 A | * | 9/1999 | Liu ........................ 324/762 |
| 6,051,978 A | | 4/2000 | Swart |
| 6,191,601 B1 | * | 2/2001 | Swart ..................... 324/761 |
| 6,218,848 B1 | * | 4/2001 | Hembree et al. ......... 324/754 |
| 6,281,694 B1 | * | 8/2001 | Tsai ....................... 324/758 |
| 6,404,212 B1 | | 6/2002 | Mehta et al. |
| 6,501,278 B1 | | 12/2002 | Arabi |
| 6,535,006 B2 | * | 3/2003 | Shahriari et al. ......... 324/755 |
| 6,590,409 B1 | | 7/2003 | Hsiung et al. |
| 2002/0143486 A1 | * | 10/2002 | Jain et al. ................ 702/117 |
| 2003/0030453 A1 | * | 2/2003 | Mayder et al. ........... 324/754 |
| 2003/0078748 A1 | * | 4/2003 | Ayadi ...................... 702/68 |
| 2003/0085726 A1 | * | 5/2003 | Rutten .................... 324/765 |

FOREIGN PATENT DOCUMENTS

JP        2002-148291        * 5/2002

OTHER PUBLICATIONS

"Pieoprobe Probe Cards", GGB Industries, Inc., Jun. 6, 2000.

* cited by examiner

*Primary Examiner*—Vinh Nguyen
*Assistant Examiner*—Emily Y Chan
(74) *Attorney, Agent, or Firm*—Trexler, Bushnell, Giangiorgi, Blackstone & Marr, Ltd.

(57) ABSTRACT

A tester head from a tester is used to mount a probe card. A DUT/load board has a socket which is configured to hold a substrate. Probe pins from the probe card make contact with bump pads on the substrate. Signal wires from the DUT/load board are fed to the tester, and the tester is connected to a DSO with a fast rise time signal head. During testing, a signal is launched using the DSO into a coaxial cable which is connected to the test head. The launched signal and the reflected signal are captured back by the DSO, and then fed into the tester. Using this data, post processing software is used to obtain the interconnect impedance versus time for the device (i.e., package) under test. The method and apparatus can be used in connection with both Flip Chip and Wire bonded products.

13 Claims, 2 Drawing Sheets

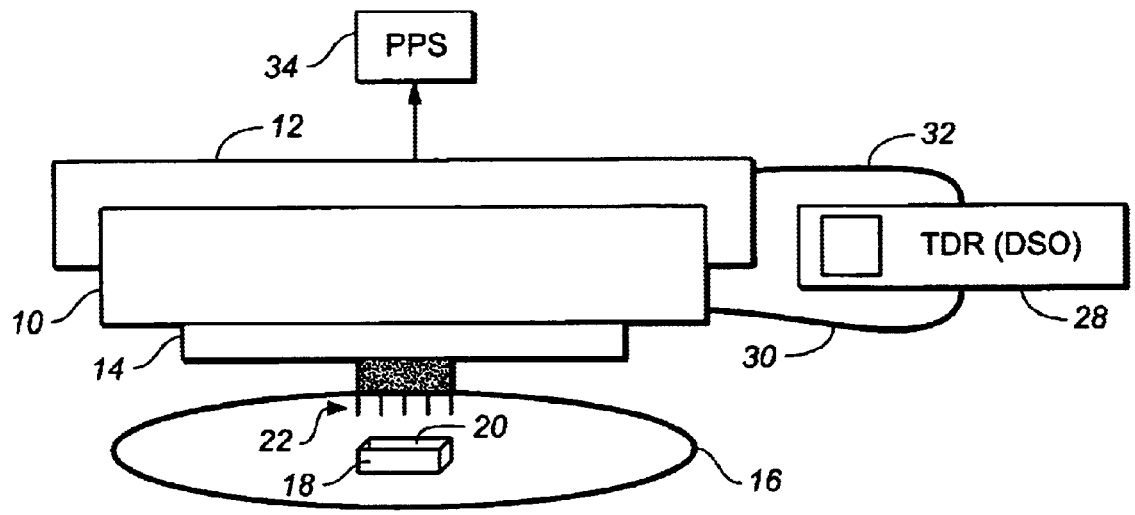
FIG._1
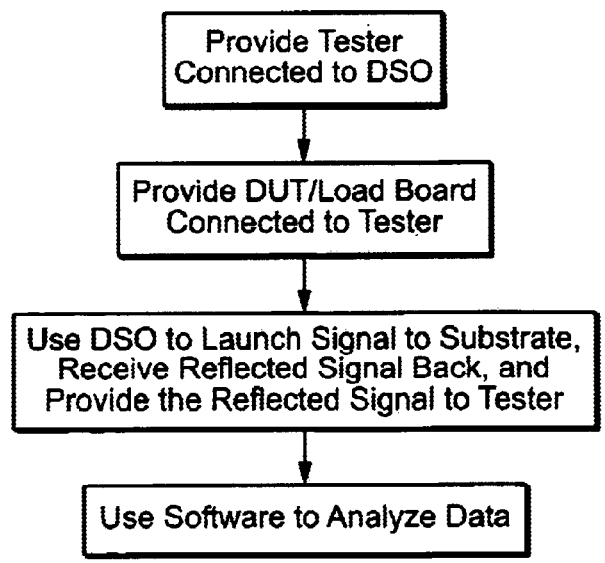
FIG._2

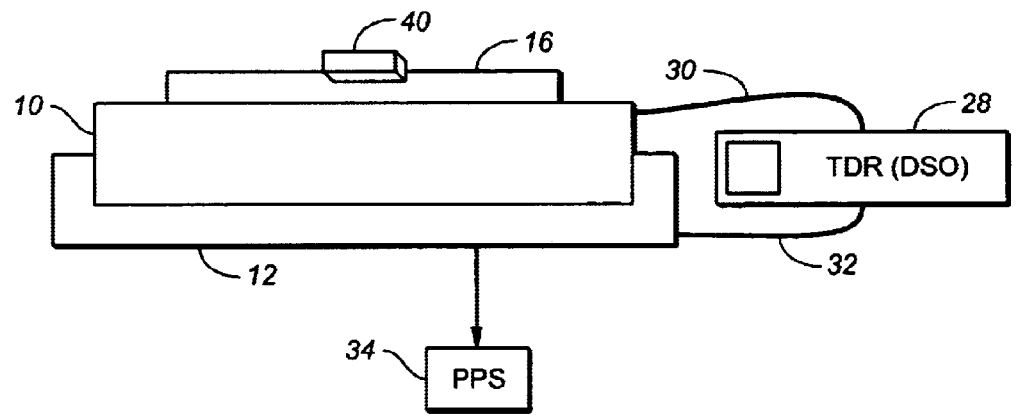
FIG._3
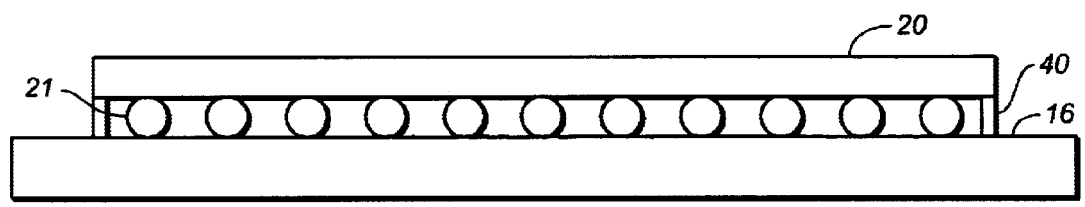
FIG._4

MEASUREMENT OF PACKAGE INTERCONNECT IMPEDANCE USING TESTER AND SUPPORTING TESTER

RELATED APPLICATION (PRIORITY CLAIM)

This application is a continuation-in-part of U.S. patent application Ser. No. 10/448,987, filed May 30, 2003 now abandoned.

BACKGROUND

The present invention generally relates to methods and apparatuses for measuring package interconnect impedance, and more specifically relates to a method and apparatus for measuring the impedance of a substrate trace in a consistent manner for large sample sizes, multiple traces, in an automated fashion.

Presently, there is no widely available method and apparatus for monitoring impedance tolerance across different substrate families with various process/assembly variations. There is no widely available method and apparatus that can measure any trace on a package, can measure multiple traces at high speed, in an automated matter. There is no widely available method and apparatus which standardizes the impedance measurement technique and which can be implemented at necessary sites.

OBJECTS AND SUMMARY

An object of an embodiment of the present invention is to provide a method and apparatus which can monitor impedance tolerance across different substrate families with various process/assembly variations.

Another object of an embodiment of the present invention is to provide a method and apparatus which can measure any trace on a package, and which can measure multiple traces at high speed, in an automated matter.

Yet another object of an embodiment of the present invention is to provide a method and apparatus which can standardize the impedance measurement technique and which can be implemented at necessary sites.

Briefly, and in accordance with at least one of the foregoing objects, an embodiment of the present invention provides a method and apparatus wherein a test head from a tester is used to mount a probe card. A device under test (DUT)/load board is provided, and the DUT/load board has a socket which is configured to hold a substrate. Probe pins from the probe card make contact with bump pads on the substrate. The probe card is either fully populated to meet the bump pads on the substrate, and all except one pin are grounded. Signal wires from the DUT/load board are fed to the tester, and the tester is connected to a Digital Sampling Oscilloscope (DSO) with a fast rise time signal head. During testing, a signal is launched using the DSO into a coaxial cable which is connected to the probe card via the test head. The launched signal and the reflected signal are captured back by the DSO, and then fed into the tester via GPIB connections (i.e., a GPIB cable). Using this data, post processing software is used to obtain the interconnect impedance versus time for the device (i.e., package) under test. The method and apparatus can be used in connection with both Flip Chip and Wire bonded products.

In another embodiment, the final test socket mounted on the load board is used. Specifically, the substrate with solder balls attached is dropped into the socket, and the DSO is connected to the tester head with a GPIB cable and to the DUT/load board with a coaxial cable. The DUT/load board, already attached to the tester head, can then be used to measure the impedance.

BRIEF DESCRIPTION OF THE DRAWINGS

The organization and manner of the structure and operation of the invention, together with further objects and advantages thereof, may best be understood by reference to the following description, taken in connection with the accompanying drawing, wherein:

FIG. 1 illustrates an apparatus which is in accordance with an embodiment of the present invention;

FIG. 2 provides a block diagram which illustrates a method which is in accordance with an embodiment of the present invention;

FIG. 3 illustrates an apparatus which is in accordance with an alternative embodiment of the present invention;

FIG. 4 is similar to FIG. 3, but provides a cross-sectional view.

DESCRIPTION

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

As shown in the FIGS. 1 and 2, an embodiment of the present invention provides a method and apparatus wherein a tester head 10 of a tester 12 is used to mount a probe card 14. A device under test (DUT)/load board 16 is provided, and the DUT/load board 16 has a socket 18 which is configured to hold a substrate 20 having solder balls 21. Probe pins 22 from the probe card 14 make contact with bump pads 24 on the substrate 20. The probe card 14 is fully populated to meet the bump pads 24 on the substrate 20, and all except one pin are grounded. The tester 12 is connected to a Digital Sampling Oscilloscope (DSO) 28 with a fast rise time signal head. During testing, a signal is launched using the DSO into a coaxial cable 30 which then connects to the tester head 10. The launched signal and the reflected signal are captured back by the DSO 28, and then fed into the tester 12 via GPIB connections (i.e., a GPIB cable 32). Using this data, post processing software 34 is used to obtain the interconnect impedance versus time for the device (i.e., package) under test. The method and apparatus can be used in connection with both Flip Chip and Wire bonded products.

Most preferably, the tester head 10 selects the pin that is going to be the signal in the probe card 14 and makes the rest of the pins ground. Then, the tester head 10 lets the TDR signal out the selected pin using the coaxial cable 30 and then allows the reflection from the DUT to get back to the TDR scope 28. The tester head 10 then uses the GPIB cable 32 connected to the DSO 28 to obtain the wave form and stores the data in a file.

FIGS. 3 and 4 illustrate an alternative embodiment. As shown, the final test socket 40 mounted on the load board 16 is used. Specifically, the substrate 20 with solder balls 21 attached is dropped into the socket 40, and the DSO 28 is connected to the tester 12 with a GPIB cable 32 and to the tester head 10 with a coaxial cable 30. The tester head 10 selects the pin that is going to the signal in the socket 40 and makes the rest of the pins ground. Then, the tester head 10 lets the TDR signal out the selected pin using the coaxial cable 30 and then allows the reflection from the DUT to get back to the TDR scope 28. The tester head 10 then uses the GPIB cable 32 connected to the DSO 28 to obtain the waveform and stores the data in a file. Post processing software 34 is used to obtain the interconnect impedance versus time for the device (i.e., package) under test.

Both embodiments of the present invention can monitor impedance tolerance across different substrate families with various process/assembly variations, can measure any trace on a package, and can measure multiple traces at high speed, in an automated matter. Both embodiments of the present invention can also standardize the impedance measurement technique and be implemented at necessary sites.

While embodiments of the present invention are shown and described, it is envisioned that those skilled in the art may devise various modifications of the present invention without departing from the spirit and scope of the appended claims.

What is claimed is:

1. A system for measuring package interconnect impedance, said system comprising: a tester head; a device under test (DUT)/load board which is configured to retain a substrate; a Digital Sampling Oscilloscope (DSO) connected to both said tester and said tester head; a probe card mounted to said tester head and contactable with said substrate, said DSO configured to launch a signal to said tester head which is receive by the substrate, said DSO configured to receive the launched signal and a reflected signal from the tester head and provide the signals to the tester, said tester configured to obtain a waveform from the DSO and store data in a file, and means configured to use the data to calculate interconnect impedance versus time data for the DUT, thereby monitoring impedance tolerance.

2. A system as recited in claim 1, wherein the probe card has probe pins.

3. The system as recited in claim 2, wherein probe pins from the probe card make contact with bump pads on the substrate.

4. The system as recited in claim 1, wherein said DUT/load board has a socket which is configured to hold said substrate.

5. The system as recited in claim 1, further comprising a coaxial cable which connects said DSO to said test head, wherein during testing, a signal is launched using the DSO into a coaxial cable which is connected to the test head.

6. The system as recited in claim 1, further comprising a GPIB cable which connected said DSO to said tester, wherein the launched signal and the reflected signal are captured back by the DSO, and then fed into the tester via GPIB connection.

7. The system as recited in claim 1, further comprising post processing software which is configured to obtain interconnect impedance versus time information.

8. A method for measuring package interconnect impedance, said method comprising: providing a tester; providing a tester head; providing a device under test (DUT)/load board which is configured to retain a substrate; providing a Digital Sampling Oscilloscope (DSO) connected to both said tester and said tester head; providing a probe card mounted to said tester head and contactable with said substrate; using said DSO to launch a signal to said tester head which is received by the substrate, wherein said DSO is configured to receive the launched signal and a reflected signal from the tester head and provide the signals to the tester; using the tester to obtain a waveform and store data in a file and using post processing software to analyze the data and provide interconnect impedance versus time data, thereby monitoring impedance tolerance.

9. The method as recited in claim 8, wherein the probe card has probe pins.

10. The method as recited in claim 9, wherein probe pins from the probe card make contact with bump pads on the substrate.

11. The method as recited in claim 8, wherein said DUT/load board has a socket which is configured to hold said substrate.

12. The method as recited in claim 8, wherein said DUT/load board has signal wires which are connected to the tester, said method further comprising providing a coaxial cable which connects said DSO to said test head, wherein dining testing, a signal is launched using the DSO into a coaxial cable which is connected to the test head.

13. The method as recited in claim 8, further comprising providing a GPIB cable which connects said DSO to said tester, wherein the launched signal and the reflected signal are captured back by the DSO, and then fed into the tester via GPIB connections.

* * * * *